(12) United States Patent
Choi et al.

(10) Patent No.: US 7,641,840 B2
(45) Date of Patent: Jan. 5, 2010

(54) METHOD FOR EXPELLING GAS POSITIONED BETWEEN A SUBSTRATE AND A MOLD

(75) Inventors: Byung-Jin Choi, Austin, TX (US);
Mahadevan GanapathiSubramanian, Austin, TX (US); Yeong-jun Choi, Cedar Park, TX (US); Mario J. Meissl, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/749,909

(22) Filed: May 17, 2007

(65) Prior Publication Data

US 2007/0228589 A1 Oct. 4, 2007

Related U.S. Application Data

(63) Continuation-in-part of application No. 11/565,393, filed on Nov. 30, 2006, and a continuation of application No. 11/389,731, filed on Mar. 27, 2006, now Pat. No. 7,224,443, which is a continuation of application No. 10/293,224, filed on Nov. 13, 2002, now Pat. No. 7,019,819.

(60) Provisional application No. 60/827,128, filed on Sep. 27, 2006, provisional application No. 60/801,265, filed on May 18, 2006, provisional application No. 60/748,380, filed on Dec. 8, 2005.

(51) Int. Cl.
 *B29D 11/00* (2006.01)
(52) U.S. Cl. ............ 264/299; 264/102; 264/293; 264/313; 264/511; 425/385; 425/396; 425/405.1; 425/420

(58) Field of Classification Search ............... 264/313, 264/314, 319, 293, 40.5, 40.1, 40.3, 101, 264/102, 494, 496, 225, 39, 2.7, 87, 511, 264/667, 500, 900, 905, 906, DIG. 78, DIG. 50, 264/81, 299; 425/383, 385, 387.1, 388, 389, 425/394, 396, 409, 412, 417, 419, 420, 437, 425/438, 441, 405.1, 405.2, 810; 430/269, 430/270.1, 271.1; 438/29, 39
See application file for complete search history.

(56) References Cited

U.S. PATENT DOCUMENTS 3,637,381 A 1/1972 Hallman et al.
3,997,447 A 12/1976 Breton et al.

(Continued)

FOREIGN PATENT DOCUMENTS

JP 57032629 2/1982

(Continued)

OTHER PUBLICATIONS

Abstract of Japanese Patent 4-148549.

(Continued)

*Primary Examiner*—Steven P Griffin
*Assistant Examiner*—Seyed Masoud Malekzadeh
(74) *Attorney, Agent, or Firm*—Laura C. Wood

(57) ABSTRACT

The present invention is directed towards a method of expelling a gas positioned between a substrate and a mold, the substrate and the mold further having a liquid positioned therebetween.

20 Claims, 11 Drawing Sheets

U.S. PATENT DOCUMENTS

| | | | |
|---|---|---|---|
| 4,119,688 A * | 10/1978 | Hiraoka | 264/485 |
| 4,223,261 A | 9/1980 | White | |
| 4,279,628 A | 7/1981 | Wymer et al. | |
| 4,312,823 A | 1/1982 | Kraakman | |
| 4,395,211 A | 7/1983 | Broeksema et al. | |
| 4,475,223 A | 10/1984 | Taniguchi et al. | |
| 4,506,184 A | 3/1985 | Siddall | |
| 4,512,848 A | 4/1985 | Deckman et al. | |
| 4,521,175 A | 6/1985 | Medwel | |
| 4,551,192 A | 11/1985 | DilMilia et al. | |
| 4,559,717 A | 12/1985 | Scire et al. | |
| 4,689,004 A | 8/1987 | Hunkel | |
| 4,724,222 A | 2/1988 | Feldman | |
| 4,731,155 A | 3/1988 | Napoli et al. | |
| 4,767,584 A | 8/1988 | Siler | |
| 4,887,282 A | 12/1989 | Mueller | |
| 5,028,361 A | 7/1991 | Fujimoto | |
| 5,028,366 A | 7/1991 | Harakal et al. | |
| 5,213,600 A * | 5/1993 | Greschner et al. | 65/102 |
| 5,259,926 A | 11/1993 | Kuwabara et al. | |
| 5,324,012 A | 6/1994 | Aoyama et al. | |
| 5,331,371 A | 7/1994 | Mori et al. | |
| 5,338,177 A | 8/1994 | LeTouche | |
| 5,364,222 A * | 11/1994 | Akimoto et al. | 414/416.03 |
| 5,425,848 A | 6/1995 | Haisma et al. | |
| 5,427,599 A * | 6/1995 | Greschner et al. | 65/305 |
| 5,512,131 A | 4/1996 | Kumar et al. | |
| 5,515,167 A | 5/1996 | Ledger et al. | |
| 5,527,662 A * | 6/1996 | Hashimoto et al. | 430/296 |
| 5,534,073 A | 7/1996 | Kinoshita et al. | |
| 5,545,367 A | 8/1996 | Bae et al. | |
| 5,550,654 A | 8/1996 | Erdogan et al. | |
| 5,563,684 A | 10/1996 | Stagaman | |
| 5,601,641 A | 2/1997 | Stephens | |
| 5,669,303 A * | 9/1997 | Maracas et al. | 101/327 |
| 5,772,905 A | 6/1998 | Chou | |
| 5,776,748 A | 7/1998 | Singhvi et al. | |
| 5,804,089 A | 9/1998 | Suzuki et al. | |
| 5,820,769 A | 10/1998 | Chou | |
| 5,821,175 A | 10/1998 | Engelsberg | |
| 5,849,209 A | 12/1998 | Kindt-Larsen et al. | |
| 5,849,222 A | 12/1998 | Jen et al. | |
| 5,900,062 A | 5/1999 | Loewenhardt et al. | |
| 5,923,408 A | 7/1999 | Takabayashi | |
| 5,947,027 A * | 9/1999 | Burgin et al. | 101/474 |
| 5,948,470 A | 9/1999 | Harrison et al. | |
| 5,956,216 A | 9/1999 | Chou | |
| 5,997,963 A | 12/1999 | Davison et al. | |
| 6,019,166 A | 2/2000 | Viswanath et al. | |
| 6,030,275 A | 2/2000 | Lofaro | |
| 6,032,506 A * | 3/2000 | Kergen | 72/351 |
| 6,099,771 A | 8/2000 | Hudkins et al. | |
| 6,137,562 A | 10/2000 | Masuyuki et al. | |
| 6,159,400 A | 12/2000 | Laquer | |
| 6,160,430 A | 12/2000 | Drapkin et al. | |
| 6,182,510 B1 | 2/2001 | Stanke et al. | |
| 6,218,316 B1 | 4/2001 | Marsh | |
| 6,220,561 B1 | 4/2001 | Garcia | |
| 6,247,579 B1 | 6/2001 | Fuliyama et al. | |
| 6,257,866 B1 | 7/2001 | Fritz et al. | |
| 6,304,424 B1 | 10/2001 | Mett et al. | |
| 6,305,677 B1 | 10/2001 | Lenz | |
| 6,309,580 B1 | 10/2001 | Chou | |
| 6,313,567 B1 | 11/2001 | Maltabes et al. | |
| 6,334,960 B1 | 1/2002 | Willson et al. | |
| 6,355,198 B1 | 3/2002 | Kim et al. | |
| 6,383,890 B2 | 5/2002 | Takisawa et al. | |
| 6,391,217 B2 | 5/2002 | Schaffer et al. | |
| 6,407,006 B1 | 6/2002 | Levert et al. | |
| 6,416,311 B1 | 7/2002 | Springer et al. | |
| 6,461,524 B1 | 10/2002 | Tsuihiji et al. | |
| 6,482,742 B1 | 11/2002 | Chou | |
| 6,512,401 B2 | 1/2003 | Clark et al. | |
| 6,517,995 B1 | 2/2003 | Jacobson et al. | |
| 6,518,189 B1 | 2/2003 | Chou | |
| 6,580,172 B2 | 6/2003 | Mancini et al. | |
| 6,612,590 B2 | 9/2003 | Coomer et al. | |
| 6,646,662 B1 | 11/2003 | Nebashi et al. | |
| 6,696,220 B2 | 2/2004 | Bailey et al. | |
| 6,713,238 B1 | 3/2004 | Chou et al. | |
| 6,726,195 B1 | 4/2004 | Hertz et al. | |
| 6,736,408 B2 | 5/2004 | Olgado et al. | |
| 6,764,386 B2 | 7/2004 | Uziel | |
| 6,776,094 B1 | 8/2004 | Whitesides et al. | |
| 6,809,356 B2 | 10/2004 | Chou | |
| 6,809,802 B1 * | 10/2004 | Tsukamoto et al. | 355/72 |
| 6,828,244 B2 | 12/2004 | Chou | |
| 6,849,558 B2 | 2/2005 | Schaper | |
| 6,869,980 B2 | 3/2005 | Noji et al. | |
| 6,898,064 B1 | 5/2005 | Berman et al. | |
| 6,900,881 B2 | 5/2005 | Sreenivasan et al. | |
| 6,908,861 B2 | 6/2005 | Sreenivasan et al. | |
| 6,916,584 B2 | 7/2005 | Sreenivasan et al. | |
| 6,932,934 B2 | 8/2005 | Choi et al. | |
| 6,951,173 B1 | 10/2005 | Meissl et al. | |
| 6,954,275 B2 * | 10/2005 | Choi et al. | 356/614 |
| 6,965,506 B2 | 11/2005 | Howald | |
| 6,980,282 B2 | 12/2005 | Choi et al. | |
| 6,982,783 B2 | 1/2006 | Choi et al. | |
| 7,018,572 B2 | 3/2006 | Feist et al. | |
| 7,019,819 B2 | 3/2006 | Choi et al. | |
| 7,023,238 B1 | 4/2006 | Camarota | |
| 7,007,992 B2 | 7/2006 | Sreenivasan et al. | |
| 7,090,716 B2 | 8/2006 | McMackin et al. | |
| 7,144,539 B2 * | 12/2006 | Olsson | 264/293 |
| 7,150,622 B2 | 12/2006 | Choi et al. | |
| 7,179,079 B2 | 2/2007 | Sreenivasan et al. | |
| 7,224,443 B2 | 5/2007 | Choi et al. | |
| 7,245,358 B2 | 7/2007 | Nimmakayala et al. | |
| 7,259,833 B2 | 8/2007 | Nimmakayala et al. | |
| 6,771,372 B1 | 9/2007 | Traber | |
| 7,307,697 B2 | 12/2007 | GanapathiSubramanian et al. | |
| 2002/0018190 A1 | 2/2002 | Nogawa et al. | |
| 2002/0042027 A1 | 4/2002 | Chou et al. | |
| 2002/0069525 A1 | 6/2002 | Hada et al. | |
| 2002/0094496 A1 * | 7/2002 | Choi et al. | 430/322 |
| 2002/0132482 A1 | 9/2002 | Chou | |
| 2002/0150398 A1 | 10/2002 | Choi et al. | |
| 2002/0167117 A1 | 11/2002 | Chou | |
| 2003/0034329 A1 | 2/2003 | Chou | |
| 2003/0062334 A1 | 4/2003 | Lee et al. | |
| 2003/0080471 A1 | 5/2003 | Chou | |
| 2003/0080472 A1 | 5/2003 | Chou | |
| 2003/0092261 A1 | 5/2003 | Kondo et al. | |
| 2003/0179354 A1 | 9/2003 | Araki et al. | |
| 2003/0189273 A1 | 10/2003 | Olsson | |
| 2004/0009673 A1 * | 1/2004 | Sreenivasan et al. | 438/694 |
| 2004/0022888 A1 * | 2/2004 | Sreenivasan et al. | 425/174.4 |
| 2004/0029041 A1 * | 2/2004 | Shih et al. | 430/271.1 |
| 2004/0036201 A1 | 2/2004 | Chou et al. | |
| 2004/0036850 A1 | 2/2004 | Tsukamoto et al. | |
| 2004/0046288 A1 | 3/2004 | Chou | |
| 2004/0104641 A1 * | 6/2004 | Choi et al. | 310/328 |
| 2004/0110856 A1 | 6/2004 | Young et al. | |
| 2004/0118809 A1 | 6/2004 | Chou et al. | |
| 2004/0124566 A1 * | 7/2004 | Sreenivasan et al. | 264/494 |
| 2004/0129293 A1 | 7/2004 | Eichenberger | |
| 2004/0131718 A1 | 7/2004 | Chou et al. | |
| 2004/0132301 A1 | 7/2004 | Harper et al. | |
| 2004/0137734 A1 | 7/2004 | Chou et al. | |
| 2004/0141163 A1 | 7/2004 | Bailey et al. | |
| 2004/0156108 A1 | 8/2004 | Chou et al. | |
| 2004/0192041 A1 | 9/2004 | Jeong et al. | |
| 2004/0197843 A1 | 10/2004 | Chou et al. | |

| | | | |
|---|---|---|---|
| 2004/0250945 A1 | 12/2004 | Zheng et al. | |
| 2005/0037143 A1 | 2/2005 | Chou et al. | |
| 2005/0046449 A1 | 3/2005 | Davis | |
| 2005/0064005 A1 | 3/2005 | Kasumi | |
| 2005/0072757 A1 | 4/2005 | McMackin et al. | |
| 2005/0074512 A1 | 4/2005 | McMackin et al. | |
| 2005/0264134 A1 | 12/2005 | Ganapathisubramanian et al. | |
| 2005/0274693 A1* | 12/2005 | Heidari et al. | 216/52 |
| 2006/0076717 A1 | 4/2006 | Sreenivasan et al. | |
| 2006/0077374 A1 | 4/2006 | Sreenivasan et al. | |
| 2006/0172031 A1 | 8/2006 | Babbs et al. | |
| 2006/0172549 A1 | 8/2006 | Choi et al. | |
| 2006/0172553 A1 | 8/2006 | Choi et al. | |
| 2007/0063384 A1 | 3/2007 | Choi et al. | |
| 2007/0065532 A1 | 3/2007 | Choi et al. | |
| 2007/0114686 A1 | 5/2007 | Choi et al. | |
| 2007/0132152 A1 | 6/2007 | Choi et al. | |
| 2007/0170617 A1 | 7/2007 | Choi et al. | |
| 2007/0190200 A1 | 8/2007 | Cherala et al. | |
| 2007/0231422 A1 | 10/2007 | Cherala et al. | |
| 2007/0287081 A1 | 12/2007 | Cherala et al. | |
| 2008/0174046 A1 | 7/2008 | Choi et al. | |
| 2008/0204693 A1 | 8/2008 | Nimmakayala et al. | |

FOREIGN PATENT DOCUMENTS

| | | |
|---|---|---|
| JP | 57153434 | 9/1982 |
| JP | 60127935 | 7/1985 |
| JP | 1-196749 | 8/1989 |
| JP | 02-24848 | 1/1990 |
| JP | 02-92603 | 4/1990 |
| JP | 02192045 | 7/1990 |
| JP | 4148549 | 5/1992 |
| WO | WO 87/02935 | 5/1987 |
| WO | WO 99/05724 | 2/1999 |
| WO | WO 00/21689 | 4/2000 |
| WO | WO 01/47003 | 6/2001 |

OTHER PUBLICATIONS

Abstract of Japanese Patent 57-153434.
Abstract of Japanese Patent 57032629.
Abstract of Japanese Patent 60127935.
Feldman, Wafer chuck for magnification correction in X-ray lithography, Journal Vacuum Sci. Technol. B., Nov. 1, 1998, pp. 3476-3479, 16(6).
Cherala et al, U.S. Appl. No. 11/695,293, Partial Vacuum Environment Imprinting, filed Apr. 2, 2007.
PCT/US07/12071 ISR, Jul. 2, 2008.
Feynman, There's Plenty of Room at the Bottom, Dec. 1, 1959.
Johnson et al., Advances in Step and Flash Imprint Lithography, SPIE Microlithography Conference Feb. 23, 2003.
Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. Of SPIE, vol. 3676 Mar. 1, 1999.
Chou, Nanoimprint Lithography and Lithographically Induced Self-Assembly, MRS Bulletin, pp. 512-517 Jul. 1, 2001.
Choi et al., Design of Orientation Stages for Step and Flash Imprint Lithography, Precision Engineering, pp. 192-199 Jan. 1, 2001.
Xia et al., Soft Lithography, Angew. Chem. Int. Ed., pp. 550-575 Jan. 1, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanolithography: A Process for Reliable Pattern Replication, J. Vac. Sci. Technol. B, pp. 4124-4128 Nov. 1, 1996.
Chou et al., Imprint of Sub-25 nm Vias and Trenches in Polymers, Appl. Phys. Lett. 67 (21) Nov. 20, 1995.
Nguyen, Asymmetric Fluid-Structure Dynamics in Nanoscale Imprint Lithography, The University of Texas at Austin, pp. 1-111 Aug. 1, 2001.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Abstract of Japanese Patent 02-92603, Aug. 12, 2004.
Translation of Japanese Patent 02-92603. Apr. 3, 1990.
Translation of Japanese Patent 02-24848, Jan. 26, 1990.
Abstract of Japanese Patent 02-24848, Jan. 26, 1990.
Chou et al., Ultrafast and Direct Imprint of Nanostructures in Silicon, Nature, col. 417, (Jun. 2002), pp. 835-837 Jun. 1, 2002.
Chou et al., Nanoimprint Lithography, Journal of Vacuum Science Technology B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology. vol. b. 19(6) Nov. 1, 2001.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
Schneider et al., Stripes of Partially Fluorinated Alkyl Chains: Dipolar Langmuir Monolayers, J. Chem. Phys. vol. 122, Issue 9 Mar. 1, 2005.
Colburn, Dissertation for the Degree of Doctor of Philosophy, Step and Flash Imprint Lithography: A Low-Pressure, Room-Temperature Nanoimprint Lithography Aug. 1, 2001.

* cited by examiner

METHOD FOR EXPELLING GAS POSITIONED BETWEEN A SUBSTRATE AND A MOLD

CROSS-REFERENCE TO RELATED APPLICATIONS

The present application claims priority to U.S. Provisional Application No. 60/801,265, filed on May 18, 2006, entitled "Substrate Holding Apparatus and Methods for Data Storage Substrate" and U.S. Provisional Application No. 60/827,128, filed on Sep. 27, 2006, entitled "Double Side Imprinting"; and is a continuation-in-part of U.S. patent application Ser. No. 11/565,393, filed on Nov. 30, 2006, entitled "Method for Expelling Gas Positioned Between a Substrate and a Mold," which claims priority to U.S. Provisional Application No. 60/748,380, filed on Dec. 8, 2005, entitled "Method and Apparatus for Imprinting with Preshaped Templates and/or Light Curable Liquids" and is a continuation of U.S. patent application Ser. No. 11/389,731, filed on Mar. 27, 2006, now issued as U.S. Pat. No. 7,224,443 on May 29, 2007, entitled "Imprint Lithography Substrate Processing Tool for Modulating Shapes of Substrates," which is a continuation of U.S. patent application Ser. No. 10/293,224, now U.S. Pat. No. 7,019,819, filed on Nov. 13, 2002, entitled "Chucking System for Modulating Shapes of Substrates," all of which are incorporated herein by reference.

TECHNICAL FIELD

The field of the invention relates generally to nano-fabrication of structures. More particularly, the present invention is directed to a method and a system of expelling gas positioned between a substrate and a mold.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability;" United States patent application publication 2004/0065252 filed as U.S. patent application Ser. No. 10/264,926, entitled "Method of Forming a Layer on a Substrate to Facilitate Fabrication of Metrology Standards;" and U.S. Pat. No. 6,936,194, entitled "Functional Patterning Material for Imprint Lithography Processes," all of which are assigned to the assignee of the present invention.

The fundamental imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

To that end, gases may be present between the template and the substrate and within the formable liquid which may result in, inter alia, pattern distortion of the solidified layer, low fidelity of features formed in the solidified layer, and a non-uniform thickness of a residual layer of the solidified layer, all of which are undesirable. To that end, a need exists, therefore, to provide a method and a system to expel gas positioned between a substrate and a mold.

DETAILED DESCRIPTION

Figure 1:
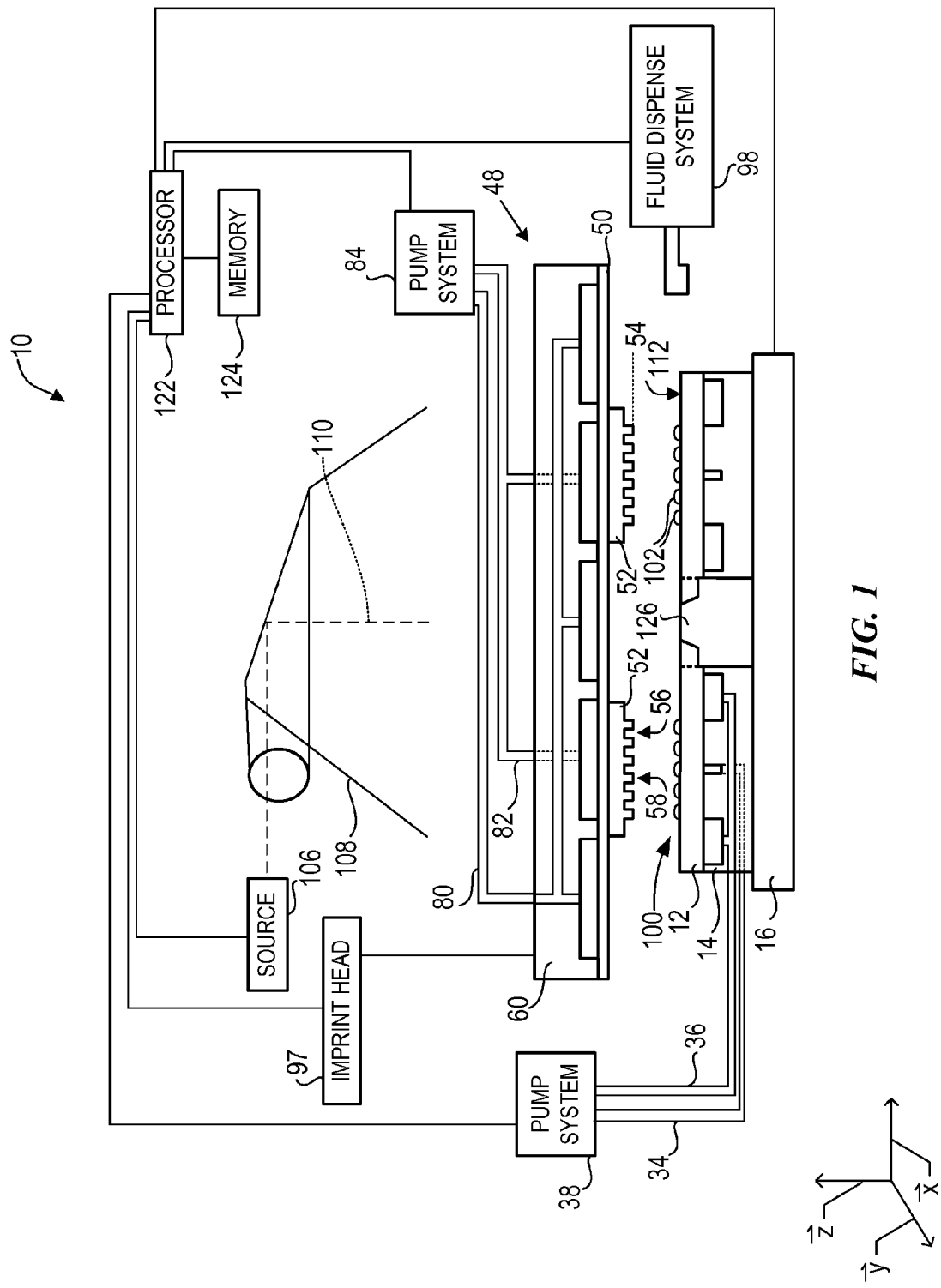
FIG. 1 is a simplified side view of a lithographic system having a patterning device spaced-apart from a substrate, the patterning device comprising a template and a mold.
Figure 2:
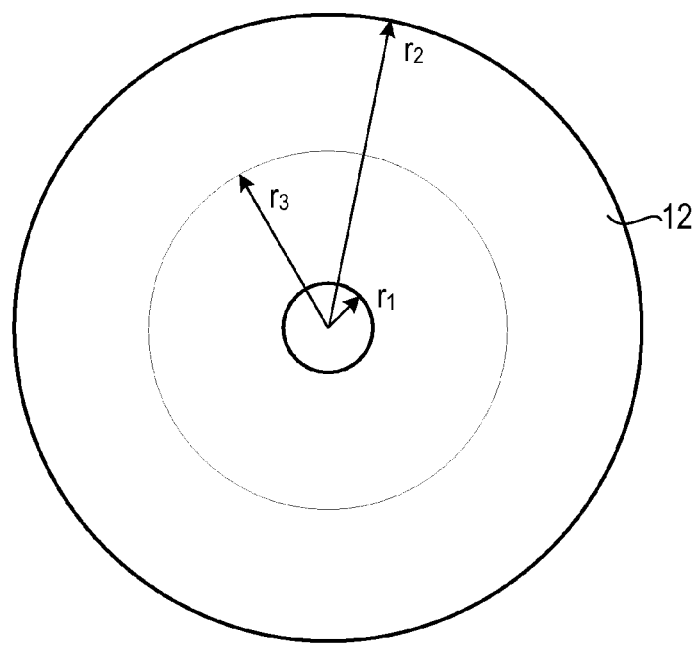
FIG. 2 is a top down view of the substrate shown in FIG. 1, the substrate having an inner, middle, and outer radius.

Referring to FIGS. 1 and 2, a system 10 to form a relief pattern on a substrate 12 is shown. Substrate 12 may have circular shape; however, in a further embodiment, substrate 12 may have any geometric shape. In the present example, substrate 12 may have a disk shape having an inner radius $r_1$ and outer radius $r_2$, with radius $r_2$ being greater than radius $r_1$. Further, defined between inner radius $r_1$ and outer radius $r_2$ is a middle radius $r_3$, with middle radius $r_3$ positioned substantially equidistant from inner radius $r_1$ and outer radius $r_2$.

Referring to FIG. 1, substrate 12 may be coupled to a substrate chuck 14. As shown substrate chuck 14 is a vacuum chuck, however, substrate chuck 14 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference. Substrate 12 and substrate chuck 14 may be supported upon a stage 16. Further, substrate 12, substrate chuck 14, and stage 16 may be positioned on a base (not shown). Stage 16 may provide motion about a first and a second axis, with the first and the second axis being orthogonal to one another, i.e., the x and y axes.

Figure 3:
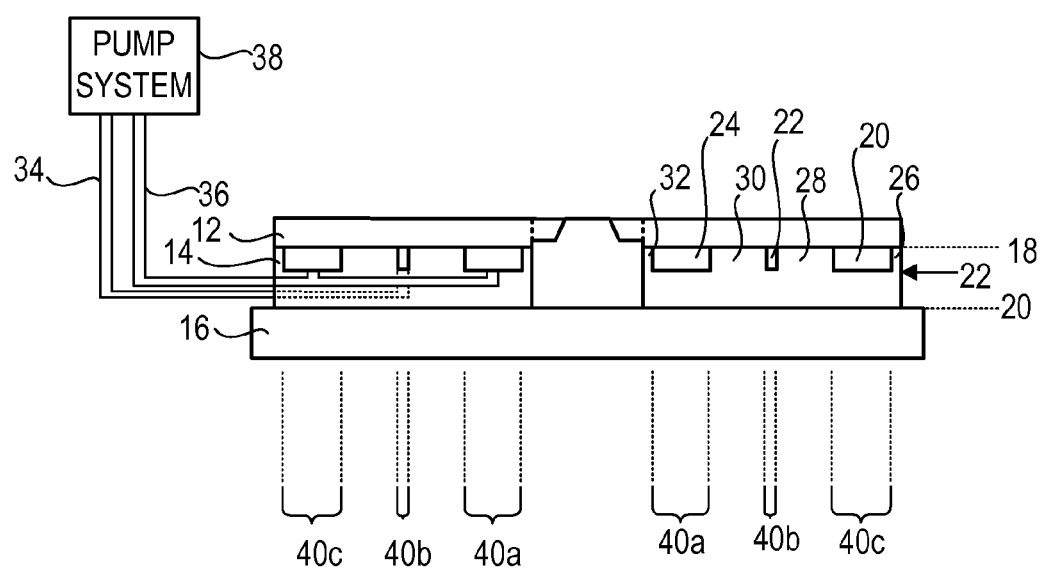
FIG. 3 is a side view of the substrate shown in FIG. 1 coupled to a substrate chuck.
Figure 4:
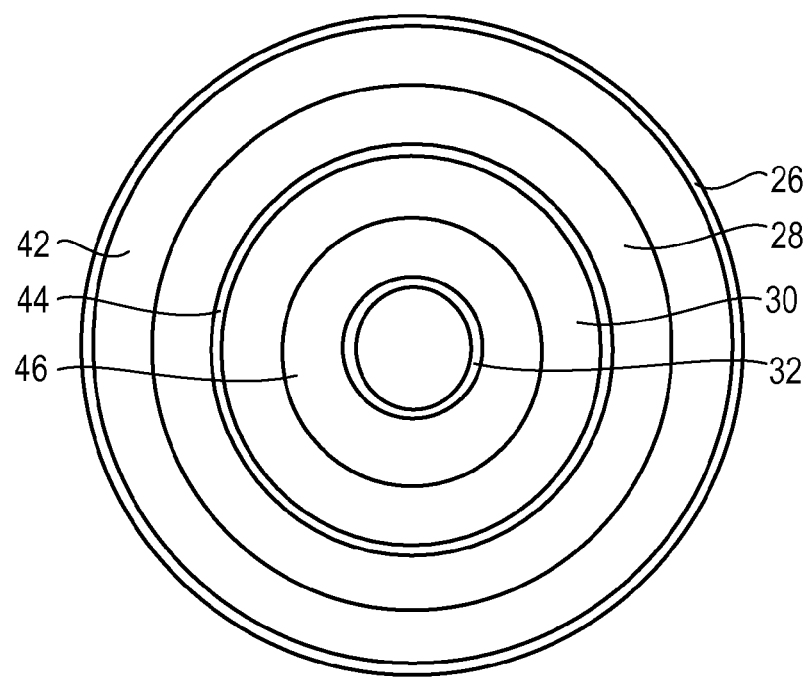
FIG. 4 is a bottom-up plan view of the substrate chuck shown in FIG. 3

Referring to FIGS. 1, 3, and 4, substrate chuck 14 includes first 18 and second 20 opposed sides. A side, or edge, surface 22 extends between first side 18 and second side 20. First side 18 includes a first recess 20, a second recess 22, and a third recess 24, defining first 26, second 28, third 30, and fourth 32 spaced-apart support regions. First support region 26 cinctures second 28, third 30, and fourth 32 support regions and first 20, second 22, and third 24 recesses. Second support region 28 cinctures third 30 and fourth 32 support regions and second 22 and third 24 recesses. Third support region 30 cinctures fourth support region 32 and third recess 24. Third recess 24 cinctures fourth support region 32. In a further embodiment, first 26, second 28, third 30, and fourth 32 support regions may be formed from a compliant material. First 26, second 28, third 30, and fourth 32 support regions may have a circular shape; however, in a further embodiment, first 26, second 28, third 30, and fourth 32 may comprise any geometric shape desired.

Formed in substrate chuck 14 are throughways 34 and 36, however, substrate chuck 12 may comprise any number of throughways. Throughway 34 places first and third recesses 20 and 24 in fluid communication with side surface 18, however, in a further embodiment, it should be understood that throughway 34 may place first and third recesses 20 and 24 in fluid communication with any surface of substrate chuck 14. Throughway 36 places second recess 22 in fluid communication with side surface 18, however, in a further embodiment, it should be understood that throughway 36 may place second recess 22 in fluid communication with any surface of substrate chuck 14. Furthermore, what is desired is that throughway 34 facilitates placing first 20 and third 24 recesses and throughway 36 facilitates placing second recesses 22 in fluid communication with a pressure control system, such as a pump system 38.

Pump system 38 may include one or more pumps to control the pressure proximate to first 20, second 22, and third 24 recesses. To that end, when substrate 12 is coupled to substrate chuck 14, substrate 12 rests against first 26, second 28, third 30, and fourth 32 support regions, covering first 20, second 22, and third 24 recesses. First recess 20 and a portion 40a of substrate 12 in superimposition therewith define a first chamber 42. Second recess 22 and a portion 40b of substrate 12 in superimposition therewith define a second chamber 44. Third recesses 24 and a portion 40c of substrate 12 in superimposition therewith define a third chamber 46. Pump system 38 operates to control a pressure in first 42, second 44, and third 46 chambers.

Figure 5:
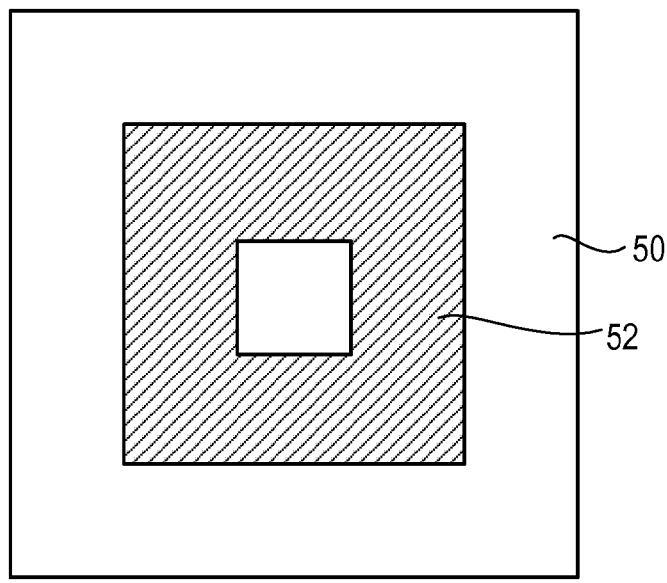
FIG. 5 is a top down view of the template shown in FIG. 1, having a mold coupled thereto.

Referring to FIGS. 1 and 5, spaced-apart from substrate 12 is a patterning device 48. Patterning device 48 comprises a template 50 having a mesa 52 extending therefrom towards substrate 12 with a patterning surface 54 thereon. Further, mesa 52 may be referred to as a mold 52. In a further embodiment, template 50 may be substantially absent of mold 52. Template 50 and/or mold 52 may be formed from such materials including but not limited to, fused-silica, quartz, silicon, organic polymers, siloxane polymers, borosilicate glass, fluorocarbon polymers, metal, and hardened sapphire. As shown, patterning surface 54 comprises features defined by a plurality of spaced-apart recesses 56 and protrusions 58. However, in a further embodiment, patterning surface 54 may be substantially smooth and/or planar. Patterning surface 54 may define an original pattern that forms the basis of a pattern to be formed on substrate 12.

Figure 6:
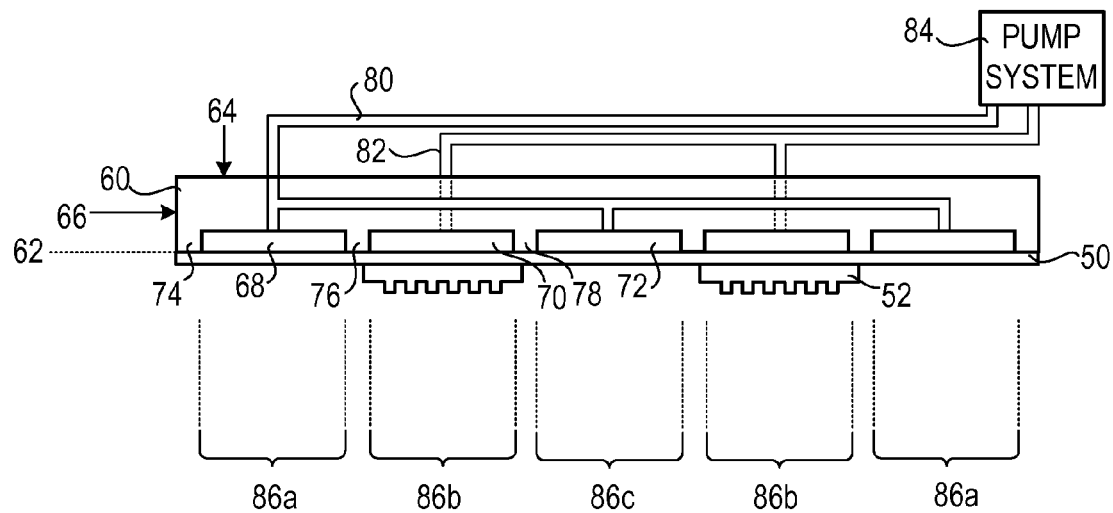
FIG. 6 is a side view of the template shown in FIG. 1 coupled to a template chuck.
Figure 7:
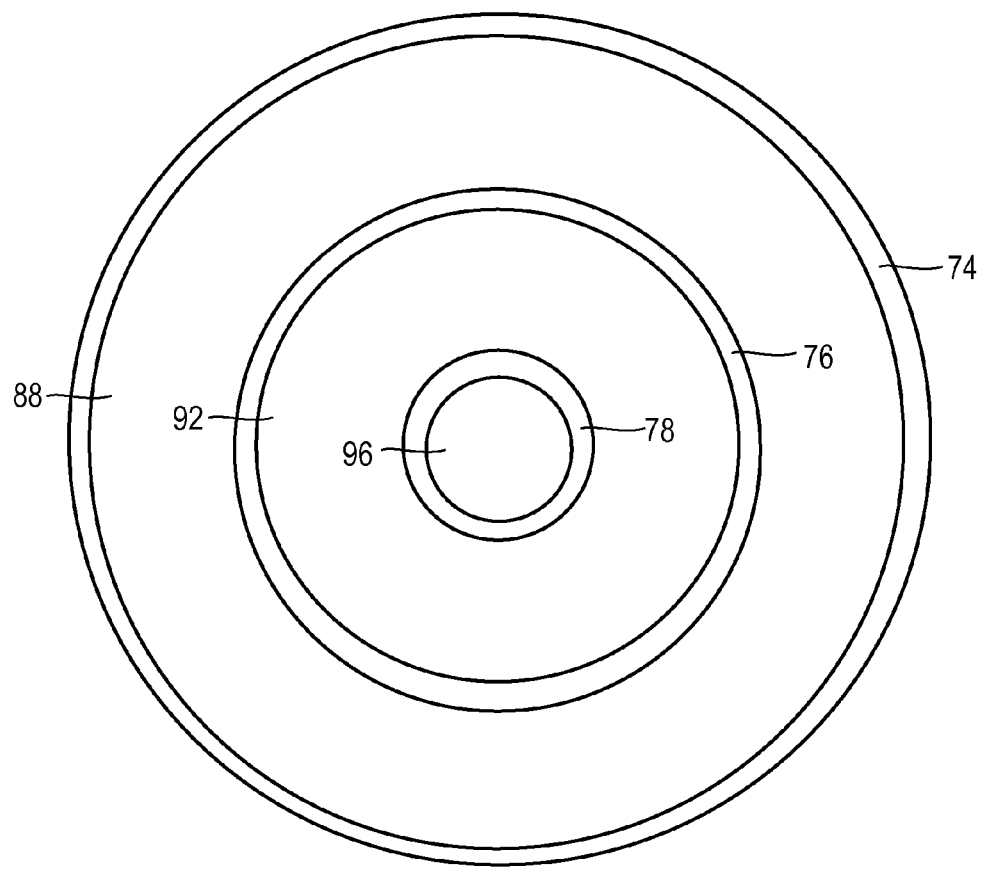
FIG. 7 is a bottom-up plan view of the template chuck shown in FIG. 6.

Referring to FIGS. 1, 6, and 7, template 50 may be coupled to a template chuck 60, template chuck 60 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes". Template chuck 60 includes first 62 and second 64 opposed sides. A side, or edge, surface 66 extends between first side 62 and second side 64. First side 62 includes a first recess 68, a second recess 70, and a third recess 72, defining first 74, second 76, and third 78 spaced-apart support regions. First support region 74 cinctures second 70 and third 72 support regions and first 68, second 70, and third 72 recesses. Second support region 76 cinctures third support region 78 and second 70 and third 72 recesses. Third support region 78 cinctures third recess 72. In a further embodiment, first 74, second 76, and third 78 support regions may be formed from a compliant material. First 74, second 76, and third 78 support regions may have a circular shape; however, in a further embodiment, first 74, second 76, and third 78 support regions may have any geometric shape desired.

Formed in template chuck 60 are throughways 80 and 82, however, template chuck 60 may comprise any number of throughways. Throughway 80 places first and third recesses 68 and 72 in fluid communication with second side 64, however, in a further embodiment, it should be understood that throughway 80 may place first and third recesses 68 and 72 in fluid communication with any surface of template chuck 60. Throughway 82 places second recess 70 in fluid communication with second side 64, however, in a further embodiment, it should be understood that throughway 80 may place second recess 70 in fluid communication with any surface of template chuck 60. Furthermore, what is desired is that throughway 80 facilitates placing first 68 and third 72 recesses and throughway 82 facilitates placing second recesses 70 in fluid communication with a pressure control system, such as a pump system 84.

Pump system 84 may include one or more pumps to control the pressure proximate to first 68, second 70, and third 72 recesses. To that end, when template 50 is coupled to template chuck 60, template 50 rests against first 74, second 76, and third 78 support regions, covering first 68, second 70, and third 72 recesses. First recess 68 and a portion 86a of template 50 in superimposition therewith define a first chamber 88. Second recess 70 and a portion 86b of template 50 in superimposition therewith define a second chamber 92. Third recess 72 and a portion 86c of substrate 12 in superimposition therewith define a third chamber 96. Pump system 84 operates to control a pressure in first 88, second 92, and third 96 chambers. Further, template chuck 60 may be coupled to an imprint head 97 to facilitate movement of patterning device 48.

Figure 8:
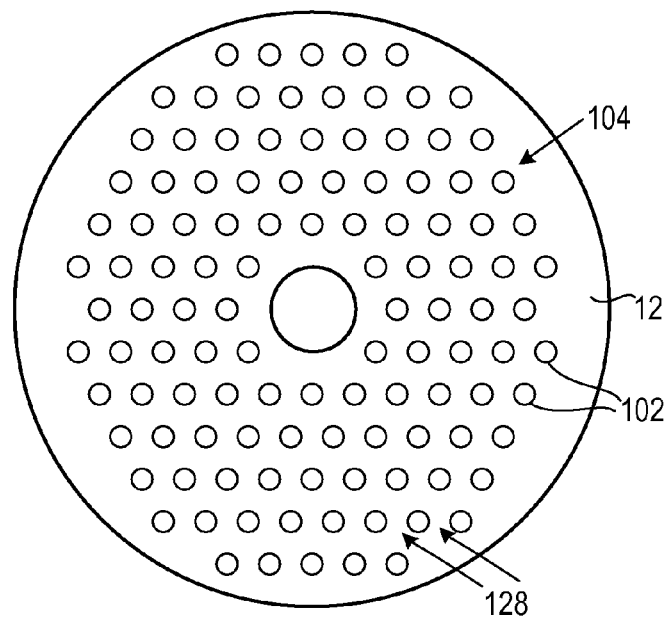
FIG. 8 is a top down view showing an array of droplets of imprinting material positioned upon a region of the substrate shown in FIG. 1.

Referring to FIG. 1, system 10 further comprises a fluid dispense system 98. Fluid dispense system 98 may be in fluid communication with substrate 12 so as to deposit polymeric material 100 thereon. Fluid dispense system 98 may comprise a plurality of dispensing units therein. It should be understood that polymeric material 100 may be deposited using any known technique, e.g., drop dispense, spin-coating, dip coating, chemical vapor deposition (CVD), physical vapor deposition (PVD), thin film deposition, thick film deposition, and the like. Typically, polymeric material 100 may be disposed upon substrate 12 before the desired volume is defined between mold 52 and substrate 12. However, polymeric material 100 may fill the volume after the desired volume has been obtained. As shown in FIG. 8, polymeric material 100 may be deposited upon substrate 12 as a plurality of spaced-apart droplets 102, defining a matrix array 104. In an example, each droplet of droplets 102 may have a unit volume of approximately 1-10 pico-liters. Droplets 102 may be arranged in any two-dimensional arrangement on substrate 12.

Figure 9:
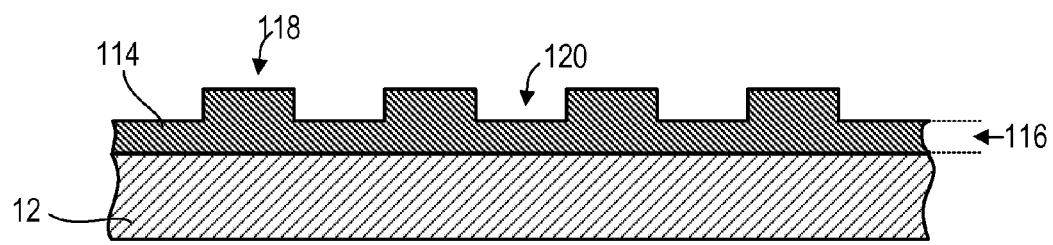
FIG. 9 is a simplified side view of the substrate shown in FIG. 1, having a patterned layer positioned thereon.

Referring to FIGS. 1 and 9, system 10 further comprises a source 106 of energy 108 coupled to direct energy 108 along a path 110. Imprint head 97 and stage 16 are configured to arrange mold 52 and substrate 12, respectively, to be in superimposition and disposed in path 110. Either imprint head 97, stage 16, or both vary a distance between mold 52 and substrate 12 to define a desired volume therebetween that is filled by polymeric material 100. After the desired volume is filled with polymeric material 100, source 106 produces energy 108, e.g., broadband ultraviolet radiation that causes polymeric material 100 to solidify and/or cross-link conforming to the shape of a surface 112 of substrate 12 and patterning surface 54, defining a patterned layer 114 on substrate 12. Patterned layer 114 may comprise a residual layer 116 and a plurality of features shown as protrusions 118 and recessions 120. Control of this process is regulated by a processor 122 that is in data communication with stage 16, pump systems 38 and 84, imprint head 97, fluid dispense system 98, and source 106, operating on a computer readable program stored in a memory 124.

Referring to FIG. 1, system 10 further includes a pin 126 coupled to stage 16. Pin 126 may translate about a third axis orthogonal to the first and second axis, i.e., along the z axis. As a result, pin 126 may contact mold 52 to alter a shape thereof, described further below. Pin 126 may be any force or displacement actuator known in the art including, inter alia, pneumatic, piezoelectric, magnetostrictive, linear, and voice coils. In a further embodiment, pin 126 may be a high resolution pressure regulator and clean series air piston, with a center pin thereof comprising a vacuum source that may evacuate an atmosphere between an interface of patterning device 48 and substrate 12.

Referring to FIGS. 1, 8, and 9, as mentioned above, a distance between mold 52 and substrate 12 is varied such that a desired volume is defined therebetween that is filled by polymeric material 100. Furthermore, after solidification, polymeric material 100 conforms to the shape of surface 112 of substrate 12 and patterning surface 54, defining patterned layer 114 on substrate 12. To that end, in a volume 128 defined between droplets 102 of matrix array 104, there are gases present, and droplets 102 in matrix array 104 are spread over substrate 12 so as to avoid, if not prevent, trapping of gases and/or gas pockets between substrate 12 and mold 52 and within patterned layer 114. The gases and/or gas pockets may be such gases including, but not limited to air, nitrogen, carbon dioxide, and helium. Gas and/or gas pockets between substrate 12 and mold 52 and within patterned layer 114 may result in, inter alia, pattern distortion of features formed in patterned layer 114, low fidelity of features formed in patterned layer 114, and a non-uniform thickness of residual layer 116 across patterned layer 114, all of which are undesirable. To that end, a method and a system of minimizing, if not preventing, trapping of gas and/or gas pockets between substrate 12 and mold 52 and within patterned layer 114 are described below.

Figure 10:
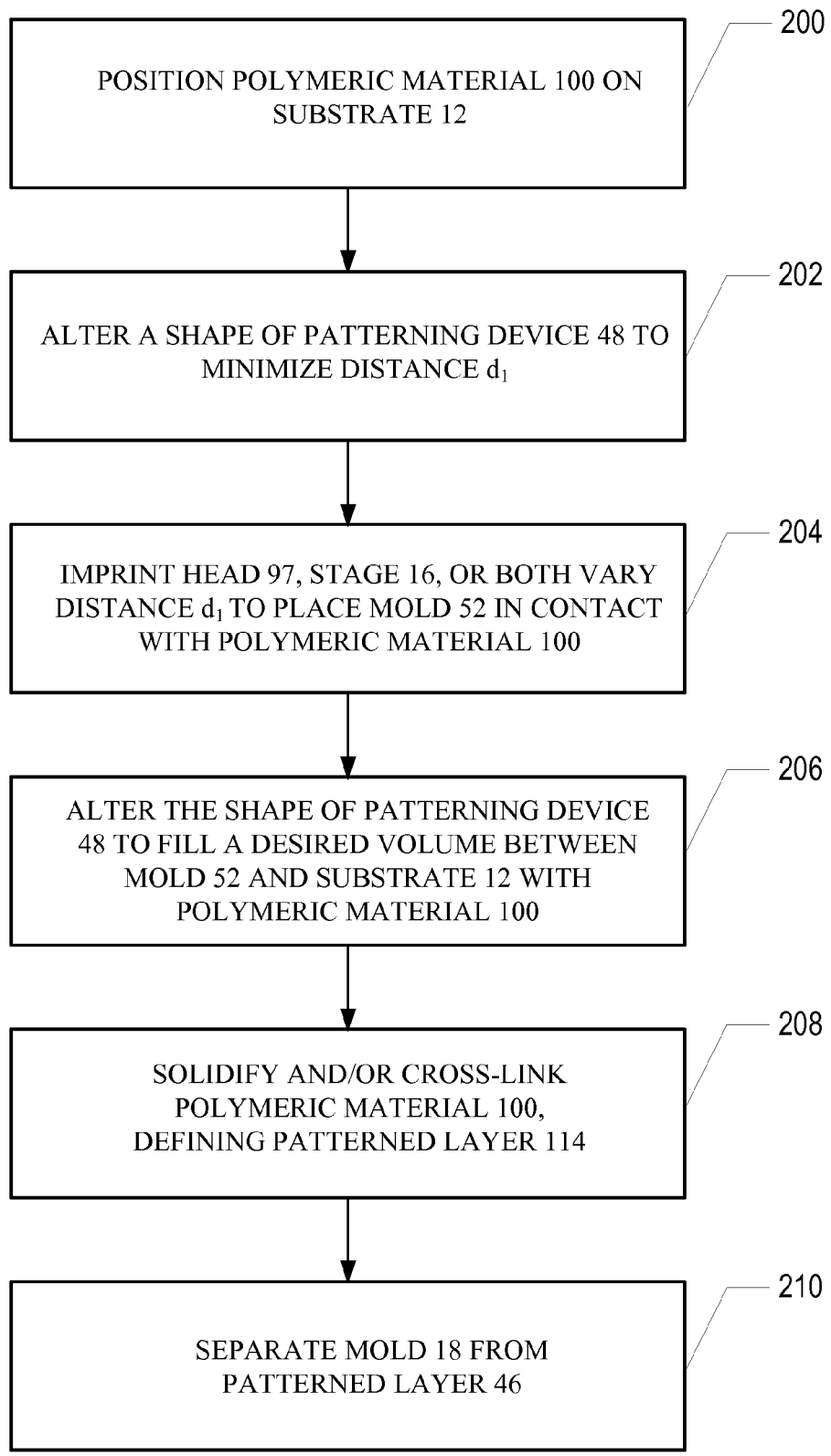
FIG. 10 is a flow diagram showing a method of patterning the substrate shown in FIG. 1, in a first embodiment.

Referring to FIGS. 1 and 10, in a first embodiment, a method of expelling gas between substrate 12 and mold 52 is shown. More specifically, at step 200, as mentioned above, polymeric material 100 may be positioned on substrate 12 by drop dispense, spin-coating, dip coating, chemical vapor deposition (CVD), physical vapor deposition (PVD), thin film deposition, thick film deposition, and the like. In a further embodiment, polymeric material 100 may be positioned on mold 52.

Referring to FIGS. 6, 7, 10, and 11, at step 202, a shape of patterning device 48 may be altered. More specifically, a shape of patterning device 48 may be altered such that a distance $d_1$ defined between mold 52 and substrate 12 at middle radius $r_3$ of substrate 12, shown in FIG. 2, is less than a distance defined between mold 52 and substrate 12 at remaining portions of mold 52. In an example, distance $d_1$ is less than a distance $d_2$, distance $d_2$ being defined at an edge of mold 52. In a further embodiment, the distance $d_1$ may be defined at any desired location of mold 52. The shape of patterning device 48 may be altered by controlling a pressure within first and third chambers 68 and 72. More specifically, as mentioned above, pump system 84 operates to control the pressure in first and third chambers 68 and 72. To that end, pump system 84 may create a vacuum within first and third chambers 68 and 72 via throughway 80 such that portions 86a and 86c of template 50 may bow away from substrate 12 and bow towards template chuck 60. As a result of bowing portions 86a and 86c of template 50 away from substrate 12, portion 86b of template 50 bows toward substrate 12 and away from template chuck 60.

Figure 11:
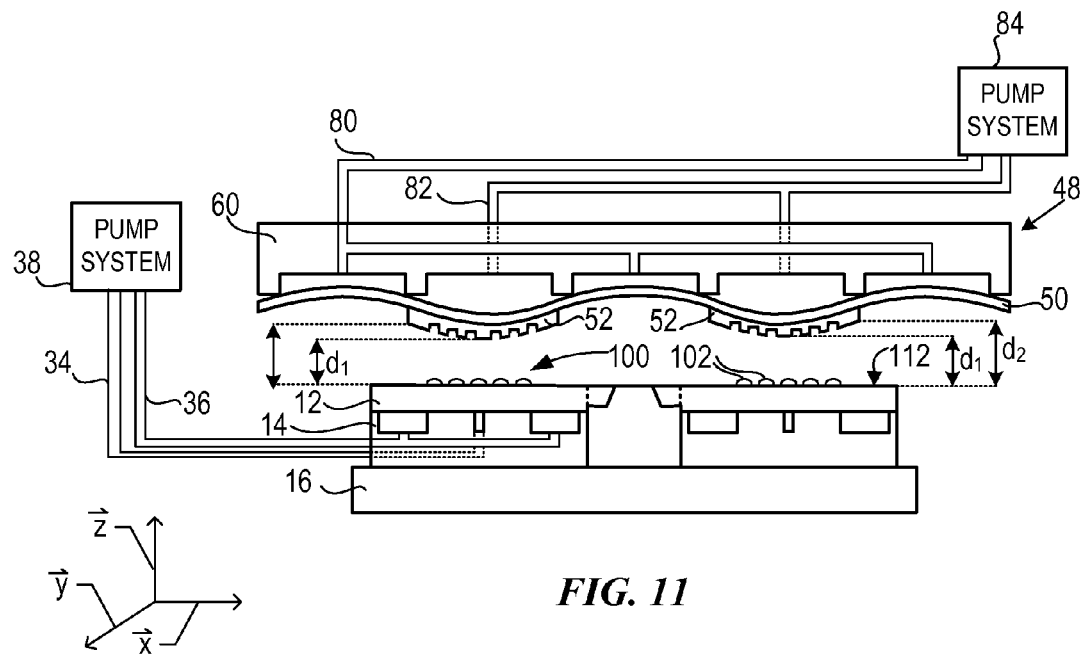
FIG. 11 is a side view of the patterning device shown in FIG. 1 having an altered shape.
Figure 12:
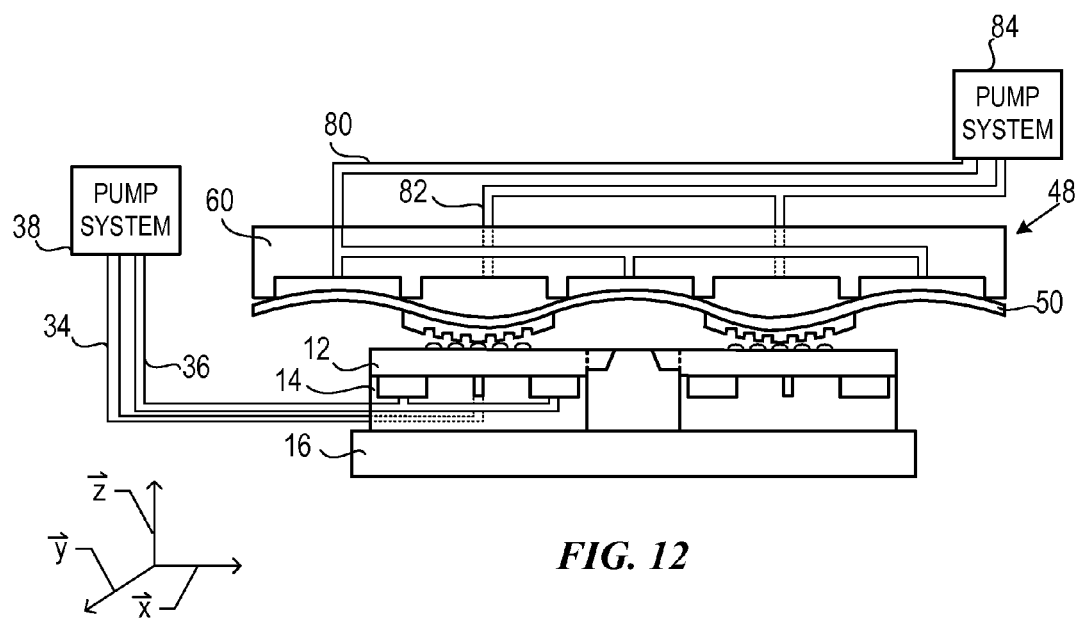
FIG. 12 is a side view of the patterning device shown in FIG. 11, in contact with a portion of the droplets of imprinting material shown in FIG. 8.
Figure 13:
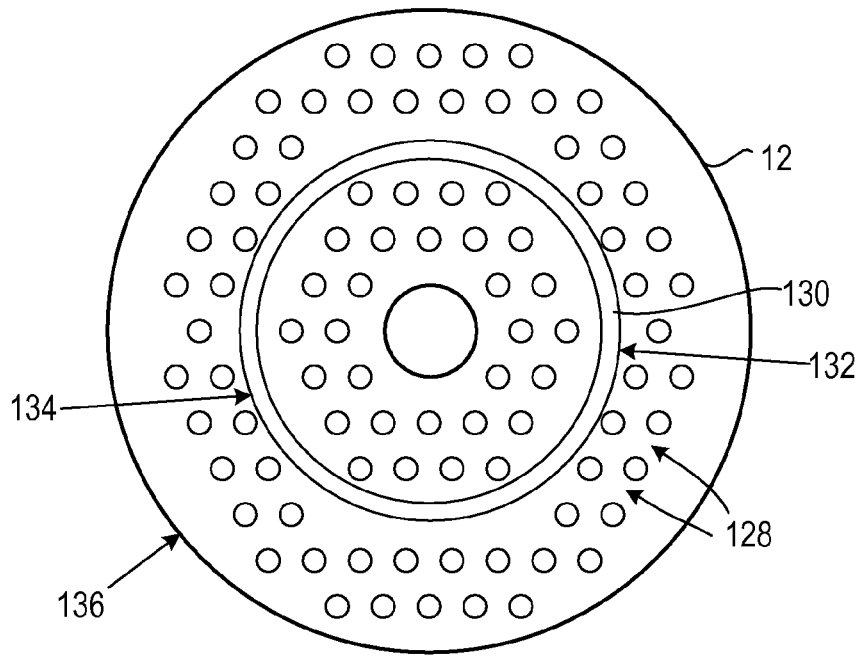
FIGS. 13-15 are top down views showing the compression of the droplets shown in FIG. 8, employing the altered shape of the template shown in FIG. 12.

Referring to FIGS. 10, 12, and 13, at step 204, as described above with respect to FIG. 1, either imprint head 97, shown in FIG. 1, stage 16, or both, may vary distance $d_1$, shown in FIG. 11, such that a portion of mold 52 contacts a sub-portion of droplets 102. As shown, a portion of mold 52 in superimposition with middle radius $r_3$ of substrate 12, shown in FIG. 2, contacts a sub-portion of droplets 102 prior to the remaining portions of mold 52 contacting the remaining droplets of droplets 102. However, in a further embodiment, any portion of mold 52 may contact droplets 102 prior to remaining portions of mold 52. To that end, as shown, mold 52 contacts all of droplets 102 in superimposition with middle radius $r_3$ of substrate 12, shown in FIG. 2, substantially concurrently. This causes droplets 102 to spread and to produce a contiguous liquid sheet 130 of polymeric material 100. Edge 132 of liquid sheet 130 defines a liquid-gas interface 134 that functions to push gases in volume 128 toward edge 136 of substrate 12. Volume 128 between droplets 102 define gas passages through which gas may be pushed to edge 136. As a result, liquid-gas interface 134 in conjunction with the gas passages reduces, if not prevents, trapping of gases in liquid sheet 130.

Figure 14:
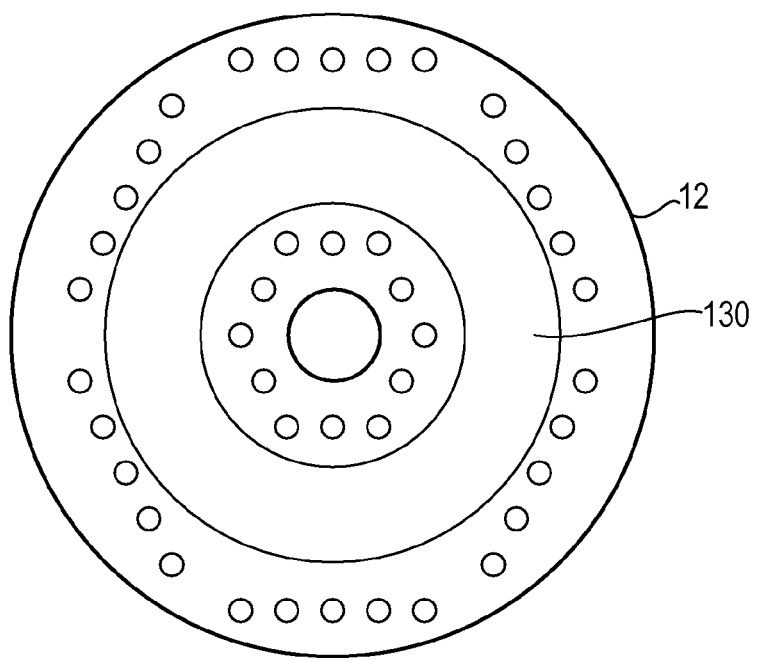
Figure 15:
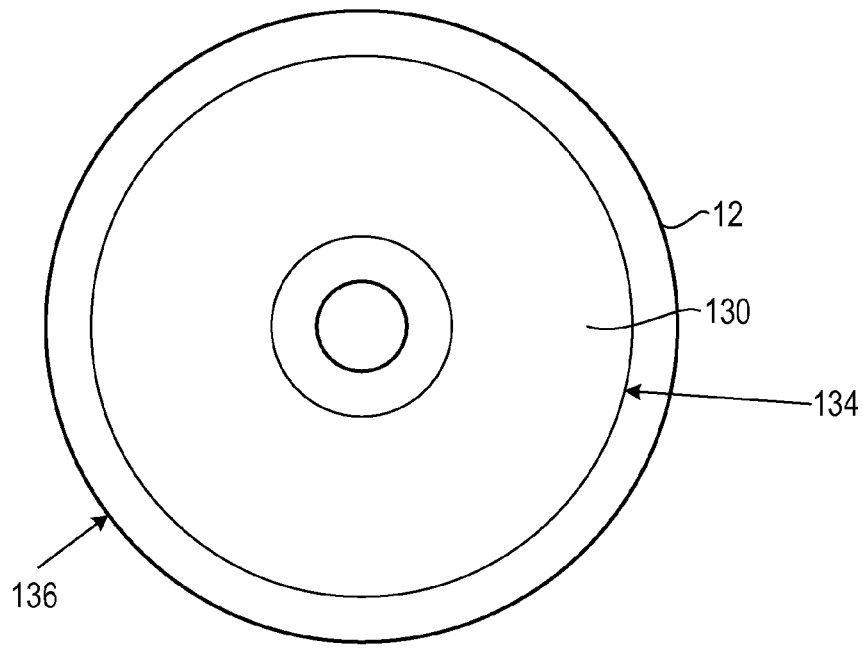

Referring to FIGS. 7, 10, and 14, at step 206, the shape of patterning device 48 may be altered such that the desired volume defined between mold 52 and substrate 12 may be filled by polymeric material 100, as described above with respect to FIG. 1. More specifically, the shape of patterning device 48 may be altered by the combination of controlling the pressure within first and third chambers 88 and 96 and a force exerted by imprint head 97, shown in FIG. 1, and/or stage 16 upon patterning device 48 as a result of contact been polymeric material 100 and mold 52. More specifically, as mentioned above, pump system 84 operates to control the pressure in first and third chambers 88 and 96. To that end, pump system 84 decreases a magnitude of the vacuum created within first and third chambers 88 and 96 via throughway 80 such that polymeric material 100 associated with subsequent subsets of droplets 100 surrounding middle radius $r_3$ of substrate 12 shown in FIG. 2, spread to become included in contiguous fluid sheet 130, as shown in FIG. 14. The shape of patterning device 48 continues to be altered such that mold 52 subsequently comes into contact with the remaining droplets 102 so that polymeric material 100 associated therewith spreads to become included in contiguous sheet 130, as shown in FIG. 15. As can be seen, interface 134 has moved towards edge 136 so that there is an unimpeded path for the gases in the remaining volume 128, shown in FIG. 8, to travel thereto. This allows gases in volume 128, shown in FIG. 8, to egress from between mold 52 and substrate 12 vis-à-vis edge 136. In this manner, the trapping of gas and/or gas pockets between substrate 12 and mold 52 and within patterned layer 114, shown in FIG. 9, is minimized, if not prevented. In a further embodiment, the shape of patterning device 48 may be altered concurrently with decreasing the distance $d_1$, as mentioned above with respect to FIG. 11.

Referring to FIGS. 7 and 12, in still a further embodiment, to facilitate altering a shape of patterning device 48, a pressure within second chamber 92 may be controlled. More specifically, as mentioned above, pump system 84 operates to control the pressure in second chamber 92. To that end, pump system 84 may create a pressure within second chamber 92 via throughway 82 such that portion 86c of template 50 may bow towards substrate 12 and bow away from template chuck 60. Further, a pressure may be created within second chamber 92 concurrently with creating a vacuum in first and third chamber 88 and 96, as mentioned above.

Referring to FIGS. 1 and 10, at step 208, as mentioned above with respect to FIG. 1, polymeric material 100 may be then be solidified and/or cross-linked, defining patterned layer 114, shown in FIG. 9. Subsequently, at step 210, mold 52 may be separated from patterned layer 114, shown in FIG. 9.

Figure 16:
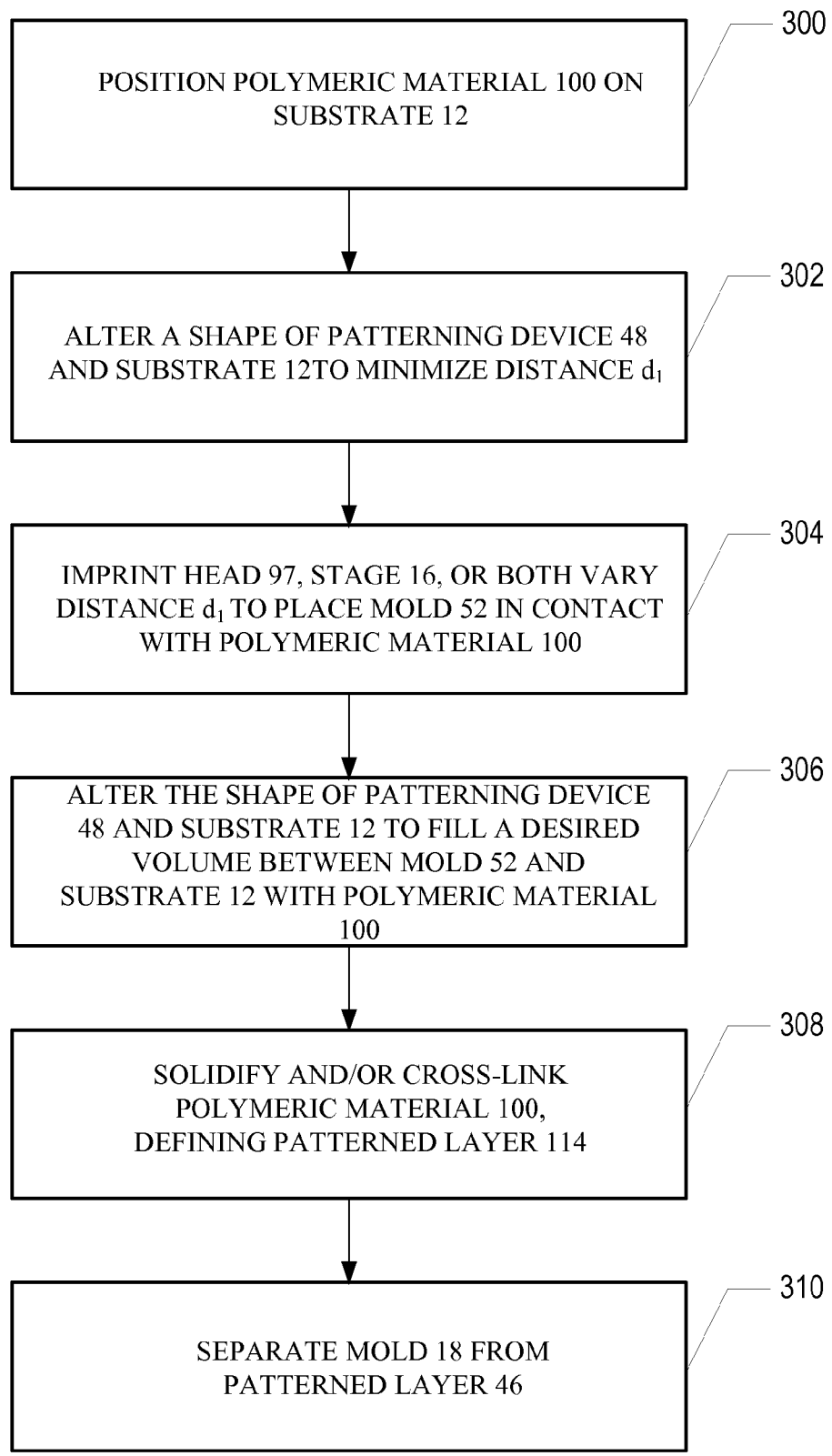
FIG. 16 is a flow diagram showing a method of patterning a region of the substrate shown in FIG. 1, in a second embodiment.

Referring to FIGS. 1 and 16, a further embodiment of the present invention is shown. More specifically, at step 300, analogous to that mentioned above with respect to step 200, shown in FIG. 10, polymeric material 100 may be positioned on substrate 12 or mold 52.

Figure 17:
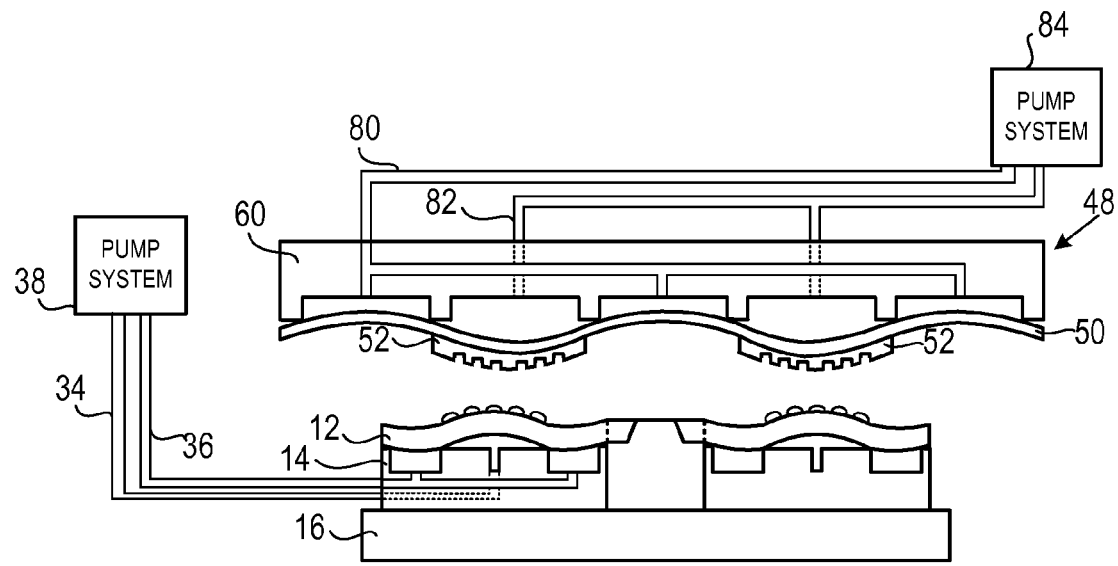
FIG. 17 is a side view of the substrate shown in FIG. 1 having an altered shape.

Referring to FIGS. 3, 4, 16, and 17, at step 302, analogous to that mentioned above with respect to step 202, shown in FIG. 10, a shape of patterning device 48 may be altered. Furthermore, concurrently with altering a shape of patterning device 48, a shape of substrate 12 may be altered. More specifically, a shape of substrate 12 may be altered by controlling a pressure within first and third chambers 42 and 46. More specifically, as mentioned above, pump system 38 operates to control the pressure in first and third chambers 42 and 46. To that end, pump system 38 may create a vacuum within first and third chambers 42 and 46 via throughway 36 such that portions 40a and 40c of substrate 12 may bow away from substrate chuck 14 and bow towards mold 52, as shown in FIG. 17. As a result of bowing portions 40a and 40c of substrate 12 toward from substrate chuck 14, portion 40b of substrate 12 bows toward mold 52 and away from substrate chuck 14. Referring to FIGS. 11, 13, and 16, at step 304, analaogus to that mentioned above with respect to step 204, shown in FIG. 10, imprint head 97, stage 16, or both, may vary distance $d_1$, shown in FIG. 11, such that a portion of mold 52 contacts a sub-portion of droplets 102 in superimposition with middle radius $r_3$ of substrate 12, shown in FIG. 2, substantially concurrently, producing contiguous liquid sheet 130 of polymeric material 100.

Referring to FIGS. 4, 12, and 16, at step 306, analogous to that mentioned above with respect to step 206, shown in FIG. 10, the shape of patterning device 48 may be altered such that the desired volume defined between mold 52 and substrate 12 may be filled by polymeric material 100. Furthermore, concurrently with altering the shape of patterning device 48, the shape of substrate 12 may be altered. More specifically, as mentioned above, pump system 38 operates to control the pressure in first and third chambers 42 and 26. To that end, pump system 38 decreases a magnitude of the vacuum created within first and third chambers 42 and 46 via throughway 36 concurrently with altering a shape of patterning device 48 as mentioned above in step 204, shown in FIG. 10, such that polymeric material 100 associated with droplets 102 surrounding middle radius $r_3$ of substrate 12, shown in FIG. 2, spread to become included in contiguous fluid sheet 130, as shown in FIG. 14. The shape of substrate 12 may be further altered concurrently with the shape of patterning device 48 being altered such that mold 52 subsequently comes into contact with the remaining droplets 102 so that polymeric material 100 associated therewith spreads to become included in contiguous sheet 130, as shown in FIG. 15. The gases in volume 128, shown in FIG. 8 may egress from between mold 52 and substrate 12 vis-à-vis edge 136 in substantially the same method as mentioned above with respect to step 206, shown in FIG. 10.

Referring to FIGS. 3 and 4, to further facilitate altering a shape of substrate 12, a pressure within second chamber 44 may be controlled. More specifically, as mentioned above, pump system 38 operates to control the pressure in second chamber 44. To that end, pump system 38 may create a pressure within second chamber 44 via throughway 34 such that portion 40b of template 50 may bow towards mold 52 and bow away from substrate chuck 14. Further, a pressure may be created within second chamber 44 concurrently with creating a vacuum in first and third chamber 42 and 46, as mentioned above.

Referring to FIGS. 1 and 10, at step 308, as mentioned above with respect to FIG. 1, polymeric material 100 may be then be solidified and/or cross-linked, defining patterned layer 114, shown in FIG. 9. Subsequently, at step 310, mold 52 may be separated from patterned layer 114, shown in FIG. 9.

Figure 18:
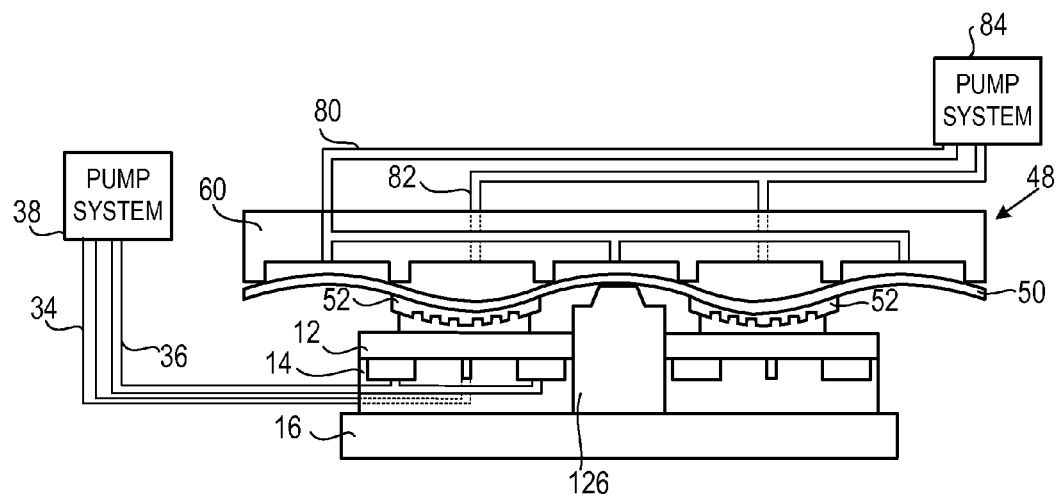
FIG. 18 is a side view of a pin exerting a force on the patterning device shown in FIG. 1, to alter a shape thereof.

Referring to FIGS. 6 and 18, in a further embodiment, to facilitate altering a shape of patterning device 48, pin 126 may be employed. More specifically, pin 126 may exert a force upon patterning device 48, and in the present example, upon third portion 86c of template 50. As a result, patterning device 48 may comprise the aforementioned desired altered shape and may be employed in any of the methods mentioned above. Pin 126 may be also employed to facilitate separation of mold 52 and substrate 12, as mentioned above with respect to steps 208 and 308, shown in FIGS. 10 and 16, respectively. Furthermore, after formation of patterned layer 114, shown in FIG. 9, pin 126 may translate away from patterned device 48 such that patterning device 48 may be substantially flat. Pin 126 may be in communication with processor 122 such that pin 126 may employ force feedback to determine a magnitude of the force.

Figure 19:
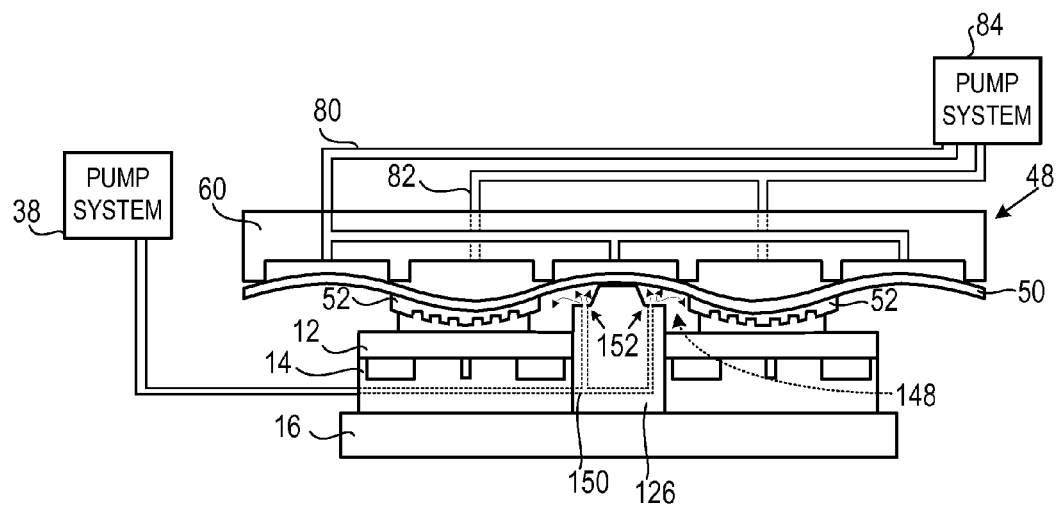
FIG. 19 is a side view of the system shown in FIG. 1, with a gas being introduced between the patterning device and the mold.

Referring to FIG. 19, to further facilitate separation of mold 52 and substrate 12, a gas 148 may be introduced between substrate 12 and mold 52 via pin 126. More specifically, pin 126 may comprise a throughway 150 having apertures 152 in fluid communication with a pressure control system, such as a pump system 38. In a further embodiment, pin 126 may comprise any number of apertures. Apertures 152 may be positioned to introduce gas 148 between mold 52 and substrate 12. Gas 148 exerts a force upon mold 52 and substrate 12 to push mold 52 in a direction away from substrate 12 and to push substrate 12 in a direction away from mold 52. As shown, gas 148 may be introduced between mold 52 and substrate 12 when pin 126 is proximate to template 50; however, in a further embodiment, gas 148 may be introduced between mold 52 and substrate 12 when pin 126 is in any position.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method for expelling a gas positioned between a substrate and a mold assembly, substrate and mold assembly further having droplets of a liquid positioned therebetween, the method comprising the steps of:
    positioning the mold assembly and the substrate such that the mold assembly is proximate to a surface of the substrate, the surface of the substrate having droplets of liquid positioned thereon, the mold assembly having a first region, a second region, and a third region, the second region surrounding the first region and the third region surrounding the first and second regions;
    altering a shape of the mold assembly by bowing the first and third regions away from the substrate to bow the second region toward the substrate to decrease a gap defined between the second region of the mold assembly and the substrate;
    contacting a sub-portion of the droplets of liquid with the second region of the mold assembly prior to contacting remaining droplets of liquid with the second region, such that the gas expels from between the substrate and the mold assembly and the droplets of liquid fill a volume defined between the mold assembly and substrate; and,
    contacting the remaining droplets of liquid with the second region of the mold assembly.

2. The method as recited in claim 1 wherein the step of altering the shape further comprises a step of creating a first pressure differential between a first chamber defined between a portion of a chuck coupled to the mold assembly and the first region of the mold assembly and a second chamber defined between a portion of the chuck and the second region of the mold assembly and creating a second pressure differential between the second chamber and a third chamber defined between a portion of a chuck coupled to the mold assembly and the third region of the mold assembly.

3. The method as recited in claim 1 wherein the step of altering the shape further comprises a step of subjecting a first chamber defined between a portion of a chuck coupled to the mold assembly and the first region of the mold assembly and an additional chamber defined between a portion of the chuck coupled to the mold assembly and the third region of the mold assembly to a vacuum.

4. The method as recited in claim 1 wherein the step of contacting the sub-portion further comprises a step of contacting a region of the liquid in superimposition with the second region of the mold assembly.

5. The method as recited in claim 1 further including applying a pressure between the substrate and the mold assembly in superimposition with the first region of the mold assembly to separate the mold assembly from the liquid on the substrate.

6. The method as recited in claim 1 further comprising the step of impinging actinic energy upon the liquid to solidify the same.

7. A method for expelling a gas positioned between a substrate and a mold assembly, the substrate and the mold assembly further having droplets of a liquid positioned therebetween, the method comprising the steps of:
    positioning the mold assembly and the substrate such that the mold assembly is proximate to the substrate, the mold assembly having a first region, a second region, and a third region, the second region surrounding the first region and the third region surrounding the first and second regions;
    altering a shape of the mold assembly by bowing the first and third regions away from the substrate to bow the second region toward the substrate to decrease a gap defined between the second region of the mold assembly and the substrate, with the first region being bowed by applying a force to a surface of the mold assembly facing the substrate;
    contacting a sub-portion of the droplets of liquid with the second region of the mold assembly prior to contacting the remaining droplets of liquid with the second region, such that the gas expels from between the substrate and the mold assembly and the liquid fills a volume defined between the mold assembly and substrate; and,
    contacting the remaining droplets of liquid with the second region of the mold assembly.

8. The method as recited in claim 7 wherein the step of altering the shape further comprises a step of creating a first pressure differential between a first chamber defined between a portion of a chuck coupled to the mold assembly and the first region of the mold assembly and a second chamber defined between a portion of the chuck and the second region of the mold assembly and creating a second pressure differential between the second chamber and a third chamber defined between a portion of a chuck coupled to the mold assembly and the third region of the mold assembly.

9. The method as recited in claim 7 wherein the step of altering the shape further comprises a step of subjecting a first chamber defined between a portion of a chuck coupled to the mold assembly and the first region of the mold assembly and an additional chamber defined between a portion of the chuck coupled to the mold assembly and the third region of the mold assembly to a vacuum.

10. The method as recited in claim 7 wherein the step of contacting the sub-portion further comprises a step of contacting a region of the liquid in superimposition with the second region of the mold assembly.

11. The method as recited in claim 7 further including applying a pressure between the substrate and the mold assembly in superimposition with the first region of the mold assembly to separate the mold assembly from the liquid on the substrate.

12. The method as recited in claim 7 further comprising the step of impinging actinic energy upon the liquid to solidify the same.

13. A method for expelling a gas positioned between a substrate and a mold assembly, the substrate and the mold assembly further having a liquid positioned therebetween, the method comprising the steps of:
- positioning the mold assembly and the substrate such that the mold assembly is proximate to the substrate, the mold assembly having a first region, a second region, and a third region, the second region surrounding the first region and the third region surrounding the first and second regions;
- altering a shape of the substrate such that an area of the substrate in superimposition with the second region of the mold assembly bows towards the mold assembly;
- altering a shape of the mold assembly by bowing the first and third regions away from the substrate to bow the second region toward the substrate to decrease a gap defined between the second region of the mold assembly and the area of the substrate in superimposition therewith;
- contacting a sub-portion of the liquid with the second region of the mold assembly prior to contacting the remaining liquid such that the gas expels from between the substrate and the mold assembly and the liquid fills a volume defined between the mold assembly and substrate; and,
- contacting the remaining liquid with the second region of the mold assembly.

14. The method as recited in claim 13 wherein the step of altering a shape of the substrate further comprises a step of creating a pressure in a first volume defined between a portion of a substrate chuck coupled to the substrate and the area of the substrate.

15. The method as recited in claim 13 wherein the step of altering a shape of the substrate further comprises a step of creating a pressure differential in a first volume defined between a portion of a substrate chuck coupled to the substrate and the area of the substrate and a second volume defined between a portion of the substrate chuck coupled to the substrate and an additional area of the substrate, the additional area surrounding the area.

16. The method as recited in claim 13 wherein the step of altering the shape further comprises a step of creating a first pressure differential between a first chamber defined between a portion of a chuck coupled to the mold assembly and the first region of the mold assembly and a second chamber defined between a portion of the chuck and the second region of the mold assembly and creating a second pressure differential between the second chamber and a third chamber defined between a portion of a chuck coupled to the mold assembly and the third region of the mold assembly.

17. The method as recited in claim 13 wherein the step of altering the shape further comprises a step of subjecting a first chamber defined between a portion of a chuck coupled to the mold assembly and the first region of the mold assembly and an additional chamber defined between a portion of the chuck coupled to the mold assembly and the third region of the mold assembly to a vacuum.

18. The method as recited in claim 13 wherein the step of contacting the sub-portion further comprises a step of contacting the liquid positioned in superimposition with the area of the substrate with the second region of the mold assembly.

19. The method as recited in claim 13 further including applying a pressure between the substrate and the mold assembly in superimposition with the first region of the mold assembly to separate the mold assembly from the liquid on the substrate.

20. The method as recited in claim 1 further comprising the step of impinging actinic energy upon the liquid to solidify the same.

* * * * *